United States Patent
Tachimori

(10) Patent No.: US 9,455,736 B2
(45) Date of Patent: Sep. 27, 2016

(54) ΔΣ MODULATOR AND PROGRAM OF ΔΣ MODULATOR

(71) Applicant: Onkyo Corporation, Osaka (JP)

(72) Inventor: Nobuya Tachimori, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 0 days.

(21) Appl. No.: 14/957,971

(22) Filed: Dec. 3, 2015

(65) Prior Publication Data

US 2016/0182082 A1 Jun. 23, 2016

(30) Foreign Application Priority Data

Dec. 22, 2014 (JP) ................. 2014-258600
Dec. 22, 2014 (JP) ................. 2014-258601

(51) Int. Cl.
*H03M 3/00* (2006.01)
(52) U.S. Cl.
CPC .................. *H03M 3/424* (2013.01)
(58) Field of Classification Search
CPC .................................. H03M 3/424
USPC ................................ 341/143–144
See application file for complete search history.

(56) References Cited

U.S. PATENT DOCUMENTS

| | | | |
|---|---|---|---|
| 5,248,972 A | 9/1993 | Karema et al. | |
| 5,742,246 A * | 4/1998 | Kuo | H03M 3/362 341/143 |
| 6,404,369 B1 * | 6/2002 | Sheen | H03M 3/322 341/143 |
| 7,081,843 B2 * | 7/2006 | Melanson | H03M 3/366 341/143 |
| 7,266,152 B2 | 9/2007 | Noguchi et al. | |
| 7,425,910 B1 * | 9/2008 | He | H03M 7/3042 341/143 |

FOREIGN PATENT DOCUMENTS

| | | |
|---|---|---|
| JP | 3142946 B | 3/2001 |
| JP | 3303585 B | 7/2002 |
| JP | 4214850 B | 1/2009 |
| WO | WO 2004/093324 A1 | 10/2004 |

OTHER PUBLICATIONS

Extended European Search Report dated Jun. 9, 2016 for corresponding European Application No. 15201265.4.

* cited by examiner

*Primary Examiner* — Khai M Nguyen
(74) *Attorney, Agent, or Firm* — Renner, Otto, Boisselle & Sklar, LLP

(57) ABSTRACT

There is provided a ΔΣ modulator including a loop filter for inputting an m-value digital signal into a subtractor, an n-value quantizer for inputting a first output signal to be output from the loop filter and outputting a second output signal as an n-value digital signal, and a selecting device for inputting the first output signal and the second output signal therein, feeding back the first output signal to a subtractor of the loop filter when an absolute value of the first output signal is a predetermined value or more, and feeding back the second output signal to the subtractor of the loop filter when the absolute value is less than a predetermined value. The predetermined value in the selecting device is set to be larger than a maximum value of an absolute value of a quantization value to be obtained by the n-value digital signal.

9 Claims, 6 Drawing Sheets

ΔΣ MODULATOR AND PROGRAM OF ΔΣ MODULATOR

BACKGROUND OF THE INVENTION

1. Field of the Invention

The present invention relates to a ΔΣ (Delta Sigma) modulator and a program thereof, and particularly relates to the ΔΣ modulator for converting an m-value (m: an integer of 3 or more) digital signal into an n-value (n: an integer of 2 or more smaller than m) so as to output the converted signal, and the program thereof.

2. Description of the Related Art

Conventionally, there has been proposed a ΔΣ modulator that converts a multi-bit digital audio signal such as a PCM (Pulse Code Modulation) audio signal into a 1-bit digital audio signal or a binary digital audio signal. The ΔΣ modulator is provided with a quantizer in a feedback loop of a loop filter, and a shape of power spectrum density distribution of a quantized noise sampled at a high speed is shaped so that a dynamic range of a band pass is improved. As a result, the m-value digital signal can be encoded into an n-value digital signal of which quantization word length is smaller. Such a noise shaping operation and setting of a sufficiently high sampling frequency enable an output signal from the ΔΣ modulator to obtain a wide dynamic range at a small quantization value.

In the ΔΣ modulator, when an amplitude level of an input signal is high with respect to a corresponding quantization value of a quantizer, an operation of ΔΣ modulation signal processing occasionally becomes unstable. For example, as to the ΔΣ modulator that outputs a binary digital audio signal from a binary quantizer at a last stage, there have been considered various countermeasures such that limiters are provided to a feedback for inputting zero data or correcting an internal state of the modulator when the operation becomes unstable.

For example, conventionally, Japanese Patent No. 3142946 discloses a high order ΔΣ modulator that is stabilized regardless of an amplitude of a modulator input signal by temporarily reducing an order of the high order modulator when an amplitude of the modulator input signal exceeds an operating range of a high order modulator. Specifically, in this ΔΣ modulator, when an input signal level detected by monitoring a voltage at a stage of an integrator exceeds a stable operating range of the high order modulator, the order of a high order modulator is reduced and the modulator is temporarily converted into a first order, second order or third order modulator that is stable regardless of the input signal level. As a result, the stability is secured and return to a first integrator stage is avoided.

Further, conventionally, Japanese Patent No. 3303585 discloses a dispersive feedback ΔΣ modulator. In this modulator, a plurality of stages of integrators, each of which adds a signal obtained by delaying a self integration output by one sample to a feedback signal, described below, and inputs the added output to a limiter, and adds the output from the limiter to the integration input to obtain the integration output, is coupled in series. In the modulator, the input signal is added to a first-stage integrator, an output from a final-stage integrator is input into a quantizer, an output signal from the quantizer is delayed by one sample and is multiplied by a suitable coefficient, and the multiplied signal is used as a feedback signal of each integrator.

Further, conventionally, as the invention in which, when a digital signal expressed by 1 bit is subject to predetermined signal processing and a digitally processed signal of which signal amplitude exceeds 1 bit is input and predetermined ΔΣ modulation processing is executed on the digitally processed signal, the processing is executed so that an amplitude of an output signal is expressed by 1 bit, Japanese Patent No. 4214850 discloses a digital signal processing apparatus. This digital signal processing apparatus includes a second or higher order first ΔΣ modulating unit having a first quantizing unit having a quantization amplitude value for enabling a signal amplitude of the processed digital signal input and quantized into at least n bit (n: an integer of 2 or more), and a second or lower order second ΔΣ modulating unit having a second quantizing unit having a quantization amplitude value for making a modulation signal output from the first ΔΣ modulating unit equal to the signal amplitude value of the digital signal.

The present invention is devised in order to easily solve the problem that shared in common with the above conventional technique, and its object is to provide a ΔΣ modulator in which an operation of ΔΣ modulation signal processing is stable even when a quantization value of an m-value digital signal input is larger than a quantization value of an n-value digital signal output and an amplitude level of an input signal input into a quantizer is comparatively large.

SUMMARY OF THE INVENTION

An object of the present invention is to provide a ΔΣ modulator of the present invention for converting an m-value (m: an integer of 3 or more) digital signal into an n-value (n: an integer of 2 or more smaller than m) digital signal and outputting the n-value digital signal, and a program thereof. The ΔΣ modulator includes a loop filter for inputting the m-value digital signal into a subtractor, an n-value quantizer for inputting a first output signal output from the loop filter therein and outputting a second output signal as the n-value digital signal, and a selecting device for inputting the first output signal and the second output signal therein, feeding back the first output signal to the subtractor of the loop filter when an absolute value of the first output signal is a predetermined value or more, and feeding back the second output signal to the subtractor of the loop filter when an absolute value of the first output signal is less than a predetermined value. The predetermined value of the selecting device is set larger than a maximum value of the absolute value of a quantization value that can be obtained by the n-value digital signal.

Preferably, in the ΔΣ modulator of the present invention, when n=2 in the n-value quantizer, a threshold with respect to an input signal for setting a value of a binary digital signal output to a first quantization value or a second quantization value, is set to zero.

Further, preferably, in the ΔΣ modulator of the present invention, when n=2, the first quantization value and the second quantization value of the n-value quantizer are set as positive and negative quantization values of which absolute values are equal to each other.

Further, a program of the present invention for causing a computer to execute ΔΣ modulation signal processing for converting an m-value (m: an integer of 3 or more) digital signal into an n-value (n: an integer of 2 or more smaller than m) digital signal so as to output the n-value digital signal. The program causes a processor of the computer to execute step of executing signal processing in a loop filter for inputting the m-value digital signal into a subtractor, step of executing n-value quantization signal processing for inputting a first output signal output from the loop filter and outputting a second output signal as the n-value digital signal, and step of executing selection processing for inputting the first output signal and the second output signal, feeding back the first output signal to the subtractor of the loop filter when an absolute value of the first output signal is a predetermined value or more, and feeding back the second output signal to the subtractor of the loop filter when the absolute value of the first output signal is less than a predetermined value. The predetermined value in the selection processing is set to be larger than a maximum value of an absolute value of a quantization value to be obtained by the n-value digital signal.

Alternately, a ΔΣ modulator of the present invention for converting an m-value (m: an integer of 3 or more) digital signal into an n-value (n: an integer of 2 or more smaller than m) digital signal and outputting the n-value output signal includes a loop filter for inputting the m-value digital signal into a subtractor, a y-value quantizer for inputting a first output signal output from the loop filter and outputting a second output signal as a y-value (y: an integer of 2 or more that satisfies m≥y≥n) digital signal, a selecting device for inputting the first output signal and the second output signal, feeding back the first output signal to the subtractor of the loop filter when an absolute value of the first output signal is a predetermined value or more, and feeding back the second output signal to the subtractor of the loop filter when the absolute value of the first output signal is less than a predetermined value, and a ΔΣ modulating unit for inputting a signal fed back to the loop filter by the selector device and outputting the n-value digital signal. The predetermined value of the selecting device is set to be larger than a maximum value of an absolute value of a quantization value to be obtained by the n-value digital signal.

Preferably, in the ΔΣ modulator of the present invention, when n=2, the ΔΣ modulating unit is a first order ΔΣ modulating unit for executing first order ΔΣ modulation signal processing or a second order ΔΣ modulating unit for executing second order ΔΣ modulation signal processing.

Preferably, in the ΔΣ modulator of the present invention, when n=y=2, a threshold with respect to an input signal for deciding a signal value of the binary digital signal output from the y-value quantizer is set to the first quantization value or the second quantization value.

Further, preferably, in the ΔΣ modulator of the present invention, when n=y=2, the first quantization value and the second quantization value of the y-value quantizer are set as positive and negative quantization values of which absolute values are equal to each other.

Further, a program of the present invention is a program for causing a computer to execute ΔΣ modulation signal processing for converting an m-value (m: an integer of 3 or more) digital signal into an n-value (n: an integer of 2 or more smaller than m) digital signal and outputting the n-value digital signal. The program causes a processor of the computer to execute step of executing signal processing in a loop filter for inputting the m-value digital signal into a subtractor, step of executing y-value quantization signal processing for inputting a first output signal output from the loop filter and outputting a second output signal as a y-value (y: an integer of 2 or more that satisfies m≥y≥n) digital signal, step of executing selection processing for inputting the first output signal and the second output signal, feeding back the first output signal to the subtractor of the loop filter when an absolute value of the first output signal is a predetermined value or more, and feeding back the second output signal to the subtractor of the loop filter when the absolute value of the first output signal is less than a predetermined value, and step of executing ΔΣ modulation processing for inputting a signal fed back to the loop filter by a selection device and outputting the n-value digital signal. The predetermined value of the selection processing is set to be larger than a maximum value of an absolute value of a quantization value to be obtained by the n-value digital signal.

Functions of the present invention are described below.

The ΔΣ modulator of the present invention for converting an m-value (m: an integer of 3 or more) digital signal into an n-value (n: an integer of 2 or more smaller than m) digital signal and outputting the n-value output signal is configuring a 1-bit ΔΣ modulator for outputting a binary digital signal when n=2. The ΔΣ modulator of the present invention can be configured by hardware or can be realized by executing a program including a plurality of steps for causing a computer to execute signal processing. Particularly, since the ΔΣ modulator of the present invention has a simple constitution, the 1-bit ΔΣ modulator that operates at a very high sampling frequency and outputs the binary digital signal is advantageous to a case of digital signal processing.

The ΔΣ modulator of the present invention includes the loop filter for inputting the m-value digital signal into the subtractor, the n-value quantizer for inputting the first output signal output from the loop filter and outputting the second output signal as the n-value digital signal, and the selecting device for inputting the first output signal and the second output signal, feeding back the first output signal to the subtractor of the loop filter when the absolute value of the first output signal is the predetermined value or more, and feeding back the second output signal to the subtractor of the loop filter when the absolute value of the first output signal is less than a predetermined value. Therefore, in the ΔΣ modulator, the input m-value digital signal is converted into the n-value digital signal so as to be output.

In the ΔΣ modulator of the present invention, the predetermined value of the selecting device is set to be larger than a maximum value of an absolute value of a quantization value to be obtained by the n-value digital signal. Therefore, the selecting device for feeding back a feedback signal to the subtractor of the loop filter selectively operates so that when the absolute value of the first output signal output from the loop filter is the predetermined value or more, the first output signal is fed back and when the absolute value of the first output signal is less than a predetermined value, the second output signal as the n-value digital signal output by the n-value quantizer is fed back. As a result, a level of the feedback signal to the loop filter configuring the ΔΣ modulator is increased according to a level of the absolute value of the first output signal output from the loop filter so that the ΔΣ modulation signal processing can be stably executed. Even when an amplitude level of the input signal input into the quantizer is comparatively high, intervention for correcting an internal state of the modulator is not necessary, so that the operation of the ΔΣ modulation signal processing can be stable.

Further, in the ΔΣ modulator, when n=2, a threshold with respect to an input signal for deciding a signal value of the binary digital signal output by the n-value quantizer to the first quantization value or the second quantization value may be set to zero. When the level of the signal output from the loop filter is 1 bit or less, the feedback signal can be a 1-bit signal, so that the operation of the 1-bit ΔΣ modulation signal processing can be stable.

Further, in the ΔΣ modulator, when n=2, the first quantization value and the second quantization value of the n-value quantizer can be set as positive and negative quantization values of which absolute values are equal to each other. In this case, a quantization error in the conversion into the binary digital signal to be output is decreased.

Alternately, the ΔΣ modulator of the present invention includes the loop filter for inputting the m-value digital signal into the subtractor, the y-value quantizer for inputting the first output signal output from the loop filter therein and outputting the second output signal as the y-value (y: an integer of 2 or more that satisfies m≥y≥n) digital signal, the selecting device for inputting the first output signal and the second output signal therein, feeding back the first output signal to the subtractor of the loop filter when the absolute value of the first output signal is the predetermined value or more and feeding back the second output signal to the subtractor of the loop filter when the absolute value of the first output signal is less than a predetermined value, and the ΔΣ modulating unit for inputting a signal fed back to the loop filter by the selecting device therein and outputting the n-value digital signal. Therefore, in the ΔΣ modulator, the m-value digital signal input is converted into the n-value digital signal so as to be output.

In the ΔΣ modulator of the present invention, the predetermined value in the selecting device is set so as to be larger than the maximum value of the absolute value of the quantization value to be obtained by the y-value digital signal. Therefore, the selecting device for feeding back a feedback signal to the subtractor of the loop filter selectively operates so that when the absolute value of the first output signal output from the loop filter is the predetermined value or more, the first output signal is fed back, when the absolute value of the first output signal is less than a predetermined value, the second output signal as the y-value digital signal output by the y-value quantizer is fed back. As a result, a level of the feedback signal to the loop filter configuring the ΔΣ modulator is increased according to a level of the absolute value of the first output signal output from the loop filter so that the ΔΣ modulation signal processing can be stably executed. Even when an amplitude level of the input signal input into the quantizer is comparatively high, intervention for correcting an internal state of the modulator is not necessary, so that the operation of the ΔΣ modulation signal processing can be stable.

Further, in the ΔΣ modulator of the present invention, when n=2, the ΔΣ modulating unit can be configured as a first order ΔΣ modulating unit for executing first-order ΔΣ modulation signal processing or a second order ΔΣ modulating unit for executing second order ΔΣ modulation signal processing. The use of the first order ΔΣ modulating unit or the second order ΔΣ modulating unit of which operation is not unstable enables the operation of the 1-bit ΔΣ modulation signal processing to be stable.

Further, in the ΔΣ modulator, when n=y=2, a threshold with respect to the input signal for deciding a signal value of a binary digital signal output by the y-value quantizer to the first quantization value or the second quantization value may be set to zero. When the level of the signal output from the loop filter is 1 bit or less, the feedback signal can be a 1-bit signal as the binary digital signal, and the operation of the 1-bit ΔΣ modulation signal processing can be stabilized.

Further, in the ΔΣ modulator, when n=y=2, the first quantization value and the second quantization value of the y-value quantizer can be set as positive and negative quantization values of which absolute values are equal to each other. In this case, a quantization error in the conversion into the binary digital signal output is decreased.

The ΔΣ modulator and the program thereof in the present invention enable the operation of the ΔΣ modulation signal processing to be stable even when a quantization value of the input m-value digital signal is larger than a quantization value of the output n-value digital signal, and an amplitude level of the input signal input into the quantizer is comparatively large.

BRIEF DESCRIPTION OF THE DRAWINGS

FIGS. 2A and 2B are graphs describing an operation of a quantizer of the ΔΣ modulator a;

DETAILED DESCRIPTION OF PREFERRED EMBODIMENTS

A ΔΣ modulator and a program thereof according to embodiments of the present invention are described below, but the present invention is not limited to the embodiments.

First Embodiment

Figure 1:
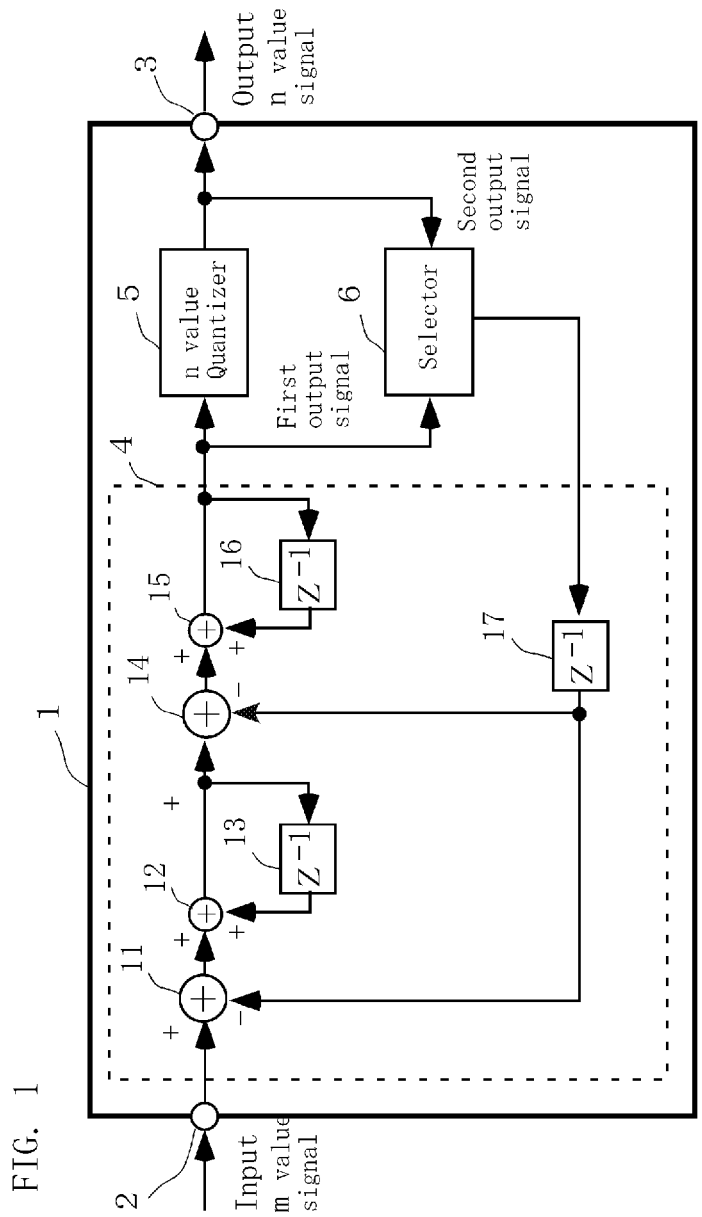
FIG. 1 is a diagram describing a ΔΣ modulator 1 according to a preferred embodiment of the present invention.

FIG. 1 is a diagram describing a ΔΣ modulator 1 according to a preferred embodiment of the present invention. Specifically, the ΔΣ modulator 1 modulates an m-value (m: an integer of 3 or more) digital signal that is a digital audio signal input into an input terminal 2 into an n-value (n: an integer of 2 or more smaller than m) digital signal and outputs the n-value digital signal from an output terminal 3. FIG. 1 is a block diagram illustrating its internal configuration. Illustration and description of some parts of the configuration that is not necessary for the description and an internal structure are omitted.

The ΔΣ modulator 1 can be configured by a digital signal processor (DSP). In this case, a microcomputer is connected as a control circuit (not illustrated) for controlling the DSP, and the microcomputer causes the DSP to load a program and to execute the program. Therefore, the ΔΣ modulator 1 can be applied to an audio device for performing 1-bit ΔΣ modulation on a multi-bit digital audio signal when n=2 and outputting the modulated signal as a binary digital audio signal.

For example, the m-value digital audio signal input into the ΔΣ modulator 1 according to this embodiment is a 16-bit PCM signal that is a data group of synchronized stereo audio signals L and R. The input m-value digital audio signal may be a 1-channel monaural signal or a 3 or more-channel multichannel signal. Therefore, FIG. 1 illustrates one signal flow corresponding to the m-value digital audio signal that is a monaural signal.

The ΔΣ modulator 1 includes a loop filter 4, an n-value quantizer 5, and a selector 6 for inputting a first output signal and a second output signal, described below, and selectively outputting one of these signals. The m-value digital signal input into the input terminal 2 of the ΔΣ modulator 1 is input into a subtractor 11 of the loop filter 4, described later. The loop filter 4 outputs the first output signal to the n-value quantizer 5 and the selector 6. The n-value quantizer 5 outputs the second output signal that is an n-value digital signal to the output terminal 3 and the selector 6. The selector 6 feeds back the output signal to the loop filter 4.

The loop filter 4 includes the subtractor 11 into which the m-value digital signal input into the input terminal 2 is input, an adder 12 into which an output signal is input from the subtractor 11, a delay device 13 into which an output signal from the adder 12 that is branched is input, a subtractor 14 into which an output signal from the adder 12 is input, an adder 15 into which an output signal from the subtractor 14 is input, a delay device 16 into which an output signal from the adder 15 that is branched is input, and a delay device 17 for delaying an output signal from the selector 6 and feeding back the output signal to the subtractor 11 and the subtractor 14.

The delay device 13, 16 or 17 of the loop filter 4 delays a digital signal input by 1 sample so as to output the delayed digital signal. ΔΣ modulation signal processing in the ΔΣ modulator 1 is executed at a sampling frequency of the n-value digital signal higher than a sampling frequency of the input m-value digital signal.

The subtractor 11 or 14 of the loop filter 4 is realized by an adder that makes one input signal added by a negative input signal obtained by inverting a phase of the other signal. Specifically, the subtractor 11 subtracts an output signal of the delay device 17 from the m-value digital signal input into the input terminal 2 so as to output the obtained signal to the adder 12. Further, the subtractor 14 subtracts the output signal of the delay device 17 from an output signal of the adder 12 so as to output the obtained signal to the adder 15.

The adder 12 adds an output signal of the subtractor 11 and an output signal of the delay device 13 so as to output the added signal to the subtractor 14. Since the output signal from the adder 12 is branched to input into the delay device 13, the adder 12 and the delay device 13 function as an integrator for integrating the output signal from the subtractor 11 so as to output the integrated signal to the subtractor 14. Similarly, the adder 15 adds an output signal from the subtractor 14 and an output signal from the delay device 16 so as to output the added signal. Since the output signal from the adder 15 is branched to be input into the delay device 16, the adder 15 and the delay device 16 function as an integrator for integrating the output signal from the subtractor 14 so as to output the integrated signal.

The loop filter 4 into which the m-value digital signal is input uses the output signal from the adder 15 as the first output signal that is an output signal of the loop filter 4. The first output signal is input into a so-called extended quantizer configured by the n-value quantizer 5 and the selector 6, and the selector 6 feeds back the output signal to the loop filter 4. Further, the n-value quantizer 5 outputs the second output signal that is the n-value digital signal to the output terminal 3. Therefore, the ΔΣ modulator 1 including the loop filter 4 according to this embodiment configures a second order ΔΣ modulator.

The subtractor 14, the adder 15, and the delay device 16 may be omitted from the above constitution so that the loop filter 4 configures a first order ΔΣ modulator. Further, the loop filter 4 may be a loop filter that configures a higher order ΔΣ modulator further including a subtractor and an integrator. Therefore, description about a detailed operation of the loop filter 4 of the ΔΣ modulator 1 according to this embodiment is omitted here.

The n-value quantizer 5 quantizes the first output signal input from the loop filter 4 into the second output signal that is the n-value digital signal so as to output the quantized signal. The second output signal output from the n-value quantizer 5 is branched to be output to the output terminal 3 and the selector 6. Therefore, for example, when n=2, the n-value quantizer 5 outputs any one of binary quantization values such as $\{0, 1\}$ and $\{-1, 1\}$ as the second output signal according to the first output signal.

The first output signal and the second output signal are input into the selector 6. The selector 6 selectively outputs the first output signal or the second output signal according to an absolute value of the first output signal, and inputs that output signal into the delay device 17 of the loop filter 4. Specifically, when the absolute value of the first output signal is a predetermined value or more, the selector 6 feeds back the first output signal to the loop filter 4. In the other cases, namely, when the absolute value of the first output signal is less than a predetermined value, the selector 6 feeds back the second output signal to the loop filter 4.

Figures 2A, 2B:
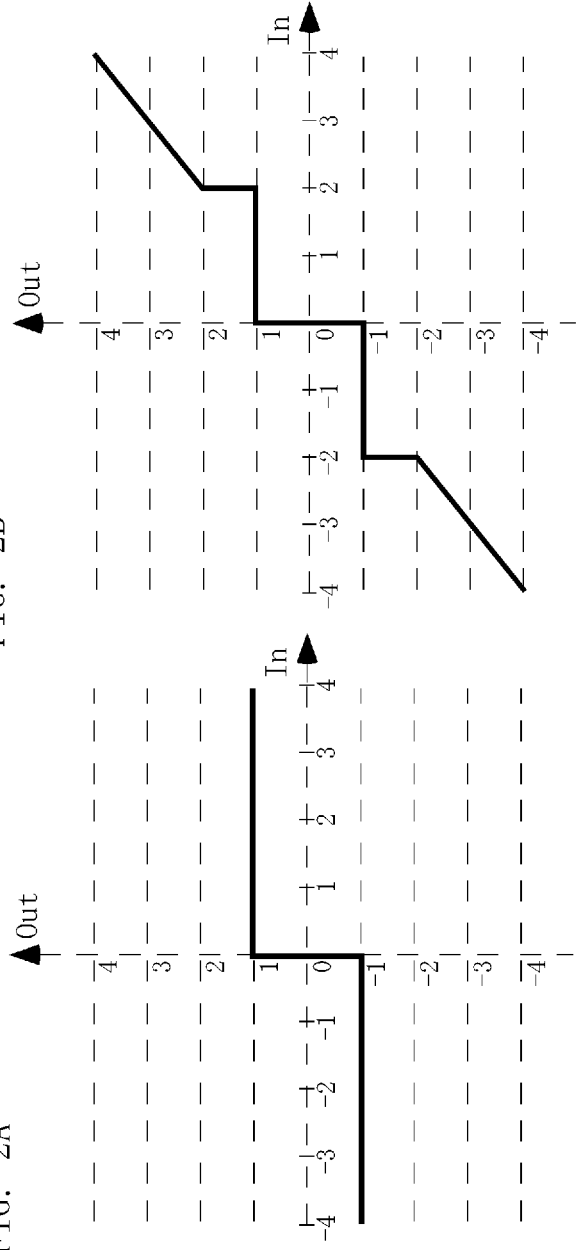

FIGS. 2A and 2B are graphs describing an operation of the quantizer of the ΔΣ modulator 1. Specifically, FIG. 2A is the graph describing the operation of the n-value quantizer 5 when n=2, and FIG. 2B is a graph describing a state that the n-value quantizer 5 and the selector 6 operate as a so-called extended quantizer. Abscissas in FIGS. 2A and 2B represent quantization values of digital signal as the first output signal output by the loop filter 4. Further, an ordinate in FIG. 2A represents a quantization value of the second output signal output from the n-value quantizer 5. Further, an ordinate in FIG. 2B represents a quantization value of a signal fed back from the selector 6 to the loop filter 4. The operations of the n-value quantizer 5 and the selector 6 of the ΔΣ modulator 1 are mainly described below with reference to FIG. 2.

As shown in FIG. 2A, when the first output signal input from the loop filter 4 has a positive value of 0 or more, the n-value quantizer 5 outputs a quantization value $\{1\}$ as the second output signal, and when the first output signal is a negative value less than 0, the n-value quantizer 5 outputs a quantization value $\{-1\}$ as the second output signal. In this case, a threshold with respect to the input signal for defining the quantization value of the second output signal output from the n-value quantizer 5 to $\{-1\}$ or $\{1\}$ is set to a zero value $\{0\}$ of the input signal. Further, the n-value quantizer 5 outputs the second output signal so as to include the positive and negative quantization values $\{-1, 1\}$ of which absolute values are equal to each other.

Further, as shown in FIG. 2B, when the absolute value of the first output signal is a predetermined value $\{2\}$ or more, the selector 6 feeds back the first output signal to the loop filter 4, and when the absolute value of the first output signal is less than a predetermined value $\{2\}$, the selector 6 feeds back the second output signal to the loop filter 4. That is to say, when the absolute value of the first output signal is less than a predetermined value $\{2\}$, the selector 6 outputs the second output signal including any one of quantization values $\{-1, 1\}$ to the loop filter 4. On the other hand, when the absolute value of the first output signal is the predetermined value $\{2\}$ or more, the selector 6 outputs the first output signal directly to the loop filter 4.

The selector 6 can set the predetermined value of the absolute value of the first output signal for deciding whether the input signal output to the loop filter 4 is switched into the first output signal or the second output signal. The predetermined value of the selector 6 may be set to be larger than a maximum value of an absolute value of the quantization value to be obtained by the n-value digital signal as an output signal. When n=2 as illustrated in FIGS. 2A and 2B, since the maximum value of the absolute value of the quantization value to be obtained by the n-value digital signal as the output signal is {1}, this condition is satisfied in the above case where the predetermined value of the absolute value of the first output signal is {2}. When the maximum value of the absolute value of the quantization value to be obtained by the n-value digital signal as the output signal is expressed by an integer, the predetermined value in the selector 6 is preferably set to be equal to a next quantization value to be obtained by {1} to the maximum value like this embodiment.

Therefore, the n-value quantizer 5 and the selector 6 operate as a so-called extended quantizer having input/output characteristics illustrated in FIG. 2B, and output a feedback signal fed back to the loop filter 4. As a result, when an amplitude level of the input signal input into the n-value quantizer 5 is comparatively high and the absolute value thereof is the predetermined value or more, the n-value quantizer 5 and the selector 6 operate so as to feed back a feedback signal, which bypasses the n-value quantizer 5, to the loop filter 4.

That is to say, in the ΔΣ modulator 1, a level of the feedback signal to the loop filter 4 configuring the ΔΣ modulator 1 is increased according to the level of the absolute value of the first output signal output from the loop filter 4 so as to be capable of stably executing the ΔΣ modulation signal processing. When the level of the feedback signal input into the subtractor 11 or 14 of the loop filter 4 increases, the amplitude level of the first output signal output from the loop filter 4 and input into the n-value quantizer 5 becomes comparatively low. For this reason, the operation of the ΔΣ modulation signal processing can be stabilized. This is equivalent to that in the ΔΣ modulator 1, when a quantization error of the n-value quantizer 5 becomes large to exceed a certain threshold, the quantization error is automatically controlled to zero.

Further, in the ΔΣ modulator 1, intervention for correcting an internal state of the ΔΣ modulator 1 is not necessary for stabilizing the operation of the ΔΣ modulation signal processing, and a limiter does not have to be provided to a route of the feedback. Even if the m-value digital signal input into the ΔΣ modulator 1 is attenuated in advance so that a head room of a digital signal is secured, a margin for attenuation can be minimum.

Further, when n=2, the ΔΣ modulator 1 can realize a stable 1-bit ΔΣ modulator 1 with a simple constitution. The n-value quantizer 5 may set a threshold with respect to the input signal, which decides the quantization value of the output second output signal for {−1} or {1}, to a zero value {0} of the input signal. Further, since the n-value quantizer 5 outputs the second output signal so that that signal includes the positive and negative quantization values {−1, 1} of which absolute values are equal to each other, a quantization error in conversion into an output binary digital signal is decreased.

FIGS. 3A and 3B are graphs describing characteristic curves of an SNR level with respect to the input signal level of the ΔΣ modulator 1. An abscissa represents an amplitude level of the sine-wave signal input of the m-value digital signal input into the input terminal 2, and a full scale of the amplitude level is decided as 0 dBFS. An ordinate represents a level of a signal-to-noise ratio with respect to the sine-wave signal input: SNR (Signal-to-Noise Ratio) that is an index frequently used as to accuracy of the conversion in the ΔΣ modulator. The SNR level preferably obtains enough large value so that the signal level of the output n-value digital signal is practically and fairly higher than a noise level and has a wider dynamic range. Further, it is preferable that the SNR level does not greatly change with respect to the input signal level. In the ΔΣ modulation signal processing in which the operation is unstable, when the signal level of the input m-value digital signal becomes high, the SNR level abruptly drops.

Figure 3:
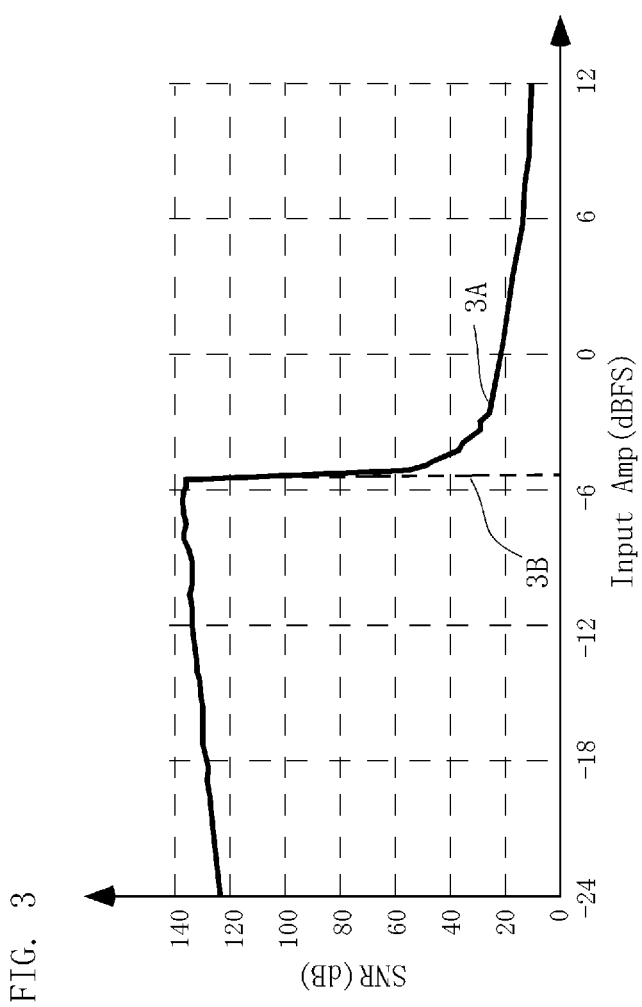
FIG. 3 is a graph describing a characteristic curve of an SNR level with respect to an input signal level of the ΔΣ modulator 1.

A curved line A3 illustrated in FIG. 3 represents a characteristic curve of the SNR level of the 1-bit ΔΣ modulator 1 according to this embodiment. The loop filter 4 of the ΔΣ modulator 1 employs eighth order CRFB (Cascade of Resonators with distributed Feedback) (not shown), and m=2^16 and n=2. Further, a curved line 3B represents a characteristic curve of the SNR level of a ΔΣ modulator 10 in a comparative example (not shown).

The ΔΣ modulator 10 of the comparative example (not shown) is a conventional 1-bit ΔΣ modulator configured not to include the selector 6 in the ΔΣ modulator 1 according to this embodiment, and is equivalent to a case where the second output signal output from the n-value quantizer 5 is fed back directly to the loop filter 4. Therefore, illustration and description about the ΔΣ modulator 10 of the comparative example are omitted.

As is clear from line 3B in FIG. 3, in the ΔΣ modulator 10 of the comparative example, when an amplitude level of the sine-wave signal input of the input m-value digital signal is increased to exceed −6 dBFS, the SNR level abruptly drops, and the SNR reaches 0 dB. This means that the operation of the ΔΣ modulator 10 becomes unstable, and a 1-bit digital signal as a suitable ΔΣ modulation signal is not output from the output terminal 3.

On the other hand, as shown by line 3A in FIG. 3, in the ΔΣ modulator 1 according to this embodiment, when the amplitude level of the sine-wave signal input of the input m-value digital signal is increased to exceed −6 dBFS, similarly the SNR level abruptly drops, but even when amplitude level of the input is further increased, the SNR does not reach 0 dB. This means that the ΔΣ modulator 1 according to this exemplary embodiment stably operates and a 1-bit digital signal as the ΔΣ modulation signal that is more suitable than a conventional example is output from the output terminal 3.

In the ΔΣ modulator 1 of this embodiment, when the amplitude level of the input signal input into the n-value quantizer 5 becomes comparatively higher than a level of the conventional technique, the operation of the ΔΣ modulation signal processing can be stabilized. That is to say, the level of the feedback signal to the loop filter 4 constituting the ΔΣ modulator is increased according to the absolute value of the first output signal output from the loop filter 4 so that the ΔΣ modulation signal processing can be executed stably. As a result, even when the amplitude level of the input signal input into the n-value quantizer 5 is comparatively high, the intervention for correcting the internal state of the modulator is not necessary, and the operation of the ΔΣ modulation signal processing can be stabilized.

The above description describes the case where m=2^16 and n=2, but the m value that means the quantization value of a digital audio signal input into the input terminal 2 may be an integer of 3 or more. Further, an n value that means the quantization value of a digital audio signal output to the output terminal 3 may be an integer of 2 or more smaller than m. For example, the ΔΣ modulator 1 can be configured as a ternary ΔΣ modulator for outputting any one of trinity quantization values {−1, 0, 1} according to the first output signal.

In the ΔΣ modulator 1 according to this embodiment, the predetermined value set in the selector 6 may be set to be at least larger than the maximum value of the absolute value of the quantization value to be obtained by the n-value digital signal. As a result, the selector 6 that feeds back a feedback signal to the subtractor of the loop filter 4 can selectively perform the operation so that when the absolute value of the first output signal output from the loop filter 4 is the predetermined value or more, the first output signal is fed back, and when the absolute value of the first output signal is less than a predetermined value, the second output signal as the n-value digital signal output from the n-value quantizer is fed back. For this reason, the operation of the ΔΣ modulation signal processing can be stabilized.

In the above description, the predetermined value set in the selector 6 is the absolute value of the first output signal (for example, {2}), but the predetermined value of the first output signal for deciding whether the input signal output to the loop filter 4 is switched into the first output signal or the second output signal may be set to different absolute values according to cases where the first output signal has a positive value and a negative value. That is to say, when the absolute value of the first output signal output from the loop filter 4 is small to a certain extent, the selector 6 may selectively operate to feed back the second output signal output by the n-value quantizer as n-value digital signal. Therefore, a positive first predetermined value and a negative second predetermined value may be separately set in the selector 6. In this case, when the first output signal is the positive first predetermined value or more, or is the negative second predetermined value or less, the selector 6 may feed back the first output signal to the subtractor of the loop filter 4, and when the first output signal is less than the positive first predetermined value and larger than the negative second predetermined value, the selector 6 may feed back the second output signal to the subtractor of the loop filter 4.

Further, in the above embodiment, the ΔΣ modulator 1 is configured by the digital signal processor (DSP), but obviously, the ΔΣ modulator 1 that realizes the ΔΣ modulation signal processing may be configured by only another processor (not illustrated) having an arithmetic function that treats an audio signal. Also in this case, a program, described below, is loaded into a processor of a computer to be executed. Therefore, the following description uses the above reference symbols in FIG. 1 to FIG. 3 in commonly and a flowchart of the program of the ΔΣ modulation signal processing is omitted.

The program of the ΔΣ modulation signal processing causes the processor to execute step S1 of executing signal processing in the loop filter 4 for inputting the m-value digital signal into the subtractor, step of S2 of executing n-value quantization signal processing for allowing the n-value quantizer 5 to input the first output signal output from the loop filter 4 and to output the second output signal as the n-value digital signal, and step S3 of executing selection processing for allowing the selector 6 to input the first output signal and the second output signal, to feed back the first output signal to the subtractor of the loop filter 4 when the absolute value of the first output signal is the predetermined value or more, and to feed back the second output signal to the subtractor of the loop filter 4 when the absolute value of the first output signal is less than a predetermined value.

At step S3, the predetermined value of the selection processing in the selector 6 is set to be larger than the maximum value of the absolute value of the quantization value to be obtained by the n-value digital signal. Therefore, the program of the ΔΣ modulation signal processing enables the m-value digital signal to be input into the processor, to be converted into the n-value digital signal and to be output.

Further, the level of the feed signal to the loop filter 4 configuring the ΔΣ modulator 1 is increased according to the level of the absolute value of the first output signal output from the loop filter 4, so that the ΔΣ modulation signal processing can be stably executed.

Obviously, when n=2, the processor can realize the 1-bit ΔΣ modulator 1 stably with a simple constitution. In the n-value quantizer 5, the threshold with respect to the input signal for deciding the quantization value of the output second output signal as {−1} or {1} may be set to zero {0} of the input signal. Further, the n-value quantizer 5 may be set to a value {−1, 1} so that the value includes the positive and negative quantization values of which absolute values are equal to each other. The quantization error in the conversion into the output binary digital signal is decreased.

Second Embodiment

Figure 4:
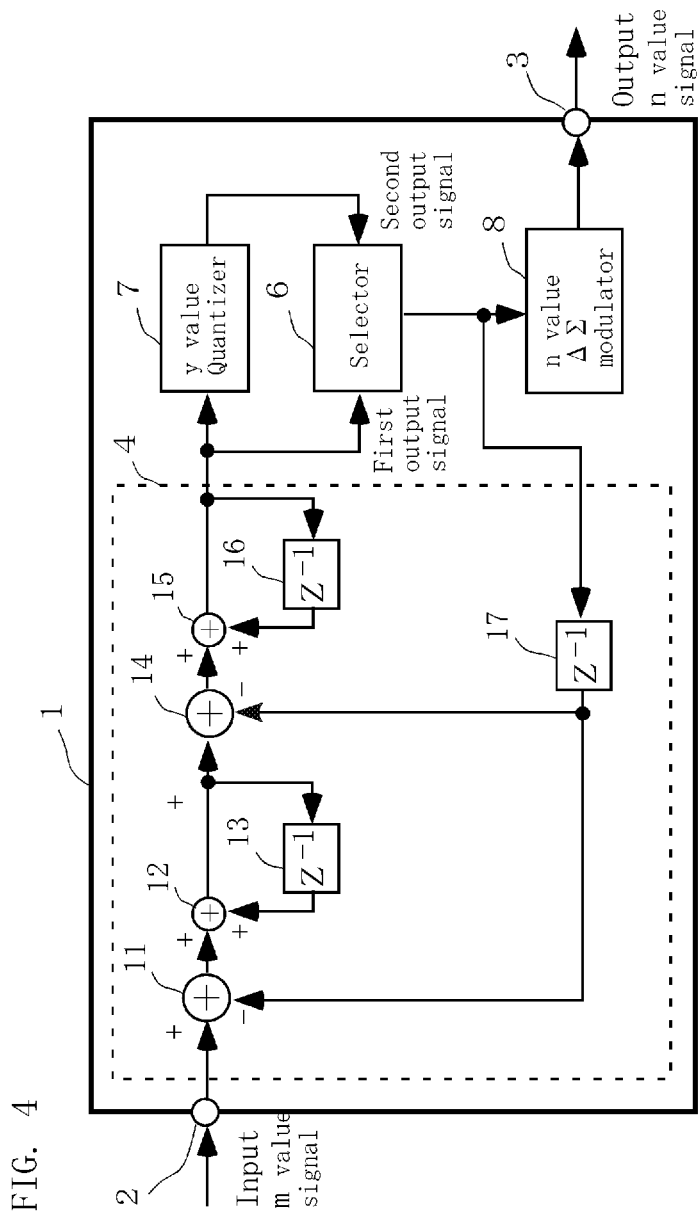
FIG. 4 is a diagram describing the ΔΣ modulator 1 according to another preferred embodiment of the present invention.

FIG. 4 is a diagram describing a ΔΣ modulator 1 according to another preferred embodiment of the present invention. Specifically, the ΔΣ modulator 1 modulates an m-value (m: an integer of 3 or more) digital signal as a digital audio signal input into an input terminal 2 into an n-value (n: an integer of 2 or more smaller than m) digital signal so as to output the n-value digital signal from the output terminal 3. FIG. 4 is a block diagram illustrating an internal constitution of the ΔΣ modulator 1. As to partial constitution that is not necessary for the description and the internal constitution that is shared in common with the first embodiment, illustration and description are omitted.

The ΔΣ modulator 1 includes a loop filter 4, a y-value quantizer 7, a selector 6 for inputting a first output signal and a second output signal, described below, and selectively outputting one of the signals, and an n-value ΔΣ modulating unit 8. The m-value digital signal input into the input terminal 2 of the ΔΣ modulator 1 is input into the subtractor 11 of the loop filter 4, described later. The loop filter 4 outputs the first output signal to the y-value quantizer 7 and the selector 6. The y-value quantizer 7 outputs the second output signal as a y-value digital signal to the selector 6. The selector 6 feeds back an output signal to the loop filter 4, and inputs the output signal to the n-value ΔΣ modulating unit 8. The n-value ΔΣ modulating unit 8 outputs an n-value digital signal to the output terminal 3.

The loop filter 4 into which the m-value digital signal is input uses the output signal from the adder 15 as the first output signal that is an output signal of the loop filter 4. The first output signal is input into a so-called extended quantizer configured by the y-value quantizer 7 and the selector 6, and the selector 6 feeds back the output signal to the loop filter 4. Further, the y-value quantizer 7 outputs the second output signal as the y-value digital signal to the selector 6. Further, the n-value ΔΣ modulating unit 8 inputs the signal fed back to the loop filter 4 therein and outputs the n-value digital signal to the output terminal 3. Therefore, the ΔΣ modulator 1 including the loop filter 4 according to this embodiment configures a second order ΔΣ modulator at a stage of the signal output to the n-value ΔΣ modulating unit 8.

In the loop filter 4, the subtractor 14, the adder 15, and the delay device 16 may be omitted from the above constitution to configure the first order ΔΣ modulator at the stage of the signal output to the n-value ΔΣ modulating unit 8. Further, the loop filter 4 may configure a high order ΔΣ modulator further including a subtractor and an integrator. Therefore, detailed description about the operation of the loop filter 4 of the ΔΣ modulator 1 according to this embodiment is omitted here.

The y-value quantizer 7 quantizes the first output signal input from the loop filter 4 into the second output signal that is the y-value digital signal so as to output the second output signal. The second output signal output from the y-value quantizer 7 is output to the selector 6. Therefore, for example, when y=2, the y-value quantizer 7 outputs a binary quantization value {0, 1} or {−1, 1} as the second output signal according to the first output signal.

Figure 5A:
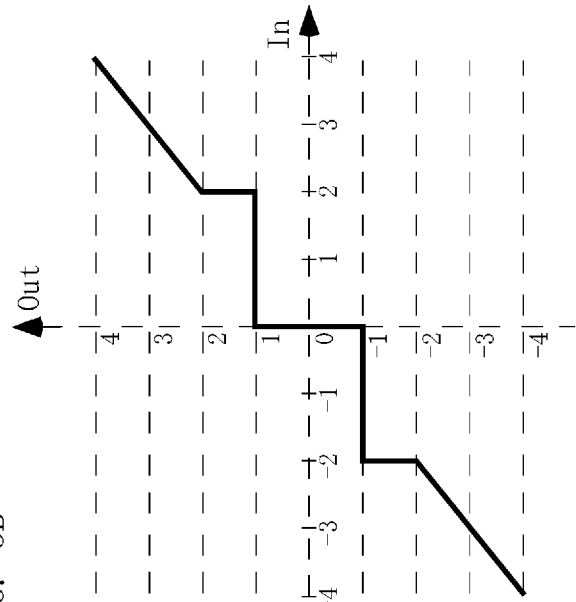
FIGS. 5A and 5B are graphs describing the quantizer of the ΔΣ modulator 1.
Figure 5B:
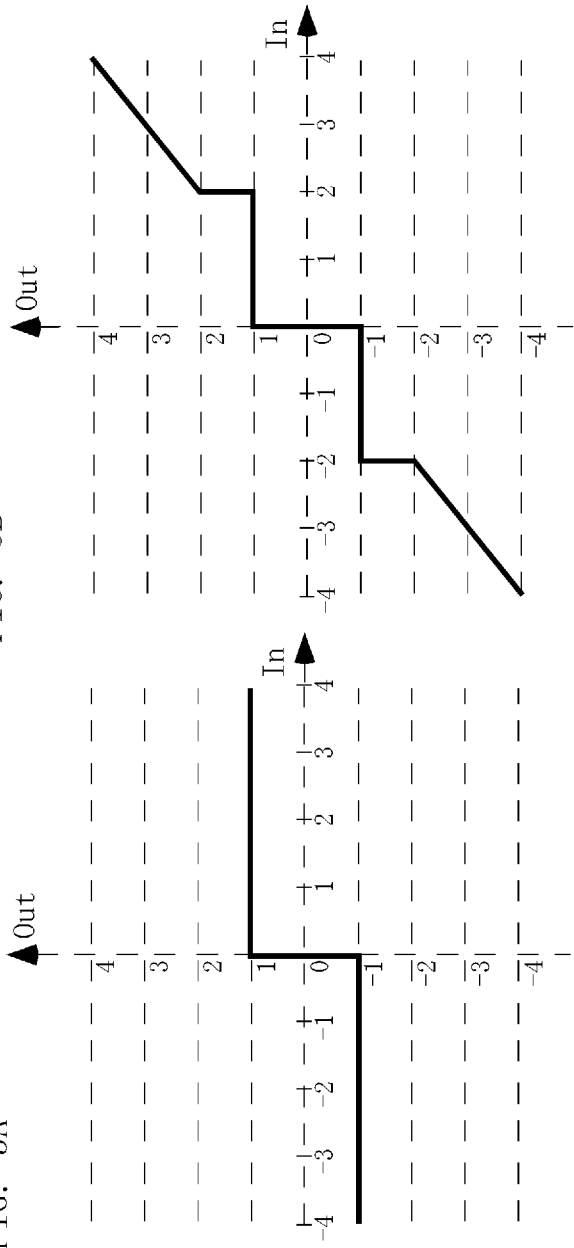

FIGS. 5A and 5B are graphs describing the operation of the quantizer of the ΔΣ modulator 1. Specifically, FIG. 5A is the graph describing the operation of the y-value quantizer 7 when y=2, and FIG. 5B is the graph describing a state that the y-value quantizer 7 and the selector 6 operate as a so-called extended quantizer. Abscissas in FIGS. 5A and 5B represent the quantization value of a digital signal of the first output signal output from the loop filter 4. Further, an ordinate in FIG. 5A represents the quantization value of the second output signal output from the y-value quantizer 7. Further, an ordinate in FIG. 5B represents the quantization value of a signal fed back from the selector 6 to the loop filter 4. The operations of the y-value quantizer 7 and the selector 6 in the ΔΣ modulator 1 are mainly described below with reference to FIGS. 5A and 5B.

As illustrated in FIG. 5A, when the first output signal input from the loop filter 4 has a positive value of 0 or more, the y-value quantizer 7 outputs the quantization value {1} as the second output signal, and when the first output signal has a negative value less than 0, the y-value quantizer 7 outputs the quantization value {−1} as the second output signal. In this case, a threshold with respect to the input signal for deciding the quantization value of the second output signal output from the y-value quantizer 7 as {−1} or {1} is set to the zero value {0} of the input signal. Further, the y-value quantizer 7 outputs the second output signal so that the second output signal includes positive and negative quantization values {−1, 1} of which absolute values are equal to each other.

Further, as illustrated in FIG. 5B, when the absolute value of the first output signal is the predetermined value {2} or more, the selector 6 feeds back the first output signal to the loop filter 4, and when the absolute value of the first output signal is less than a predetermined value {2}, the selector 6 feeds back the second output signal to the loop filter 4. That is to say, when the absolute value of the first output signal is less than a predetermined value {2}, the selector 6 outputs the second output signal including any one of the quantization values {−1, 1} to the loop filter 4. On the other hand, when the absolute value of the first output signal is the predetermined value {2} or more, the selector 6 outputs the first output signal directly to the loop filter 4.

The selector 6 can set the predetermined value of the absolute value of the first output signal for deciding whether the input signal output to the loop filter 4 is switched into the first output signal or the second output signal. The predetermined value of the selector 6 may be set to be larger than a maximum value of an absolute value of the quantization value to be obtained by the n-value digital signal as the output signal. When y=2 illustrated in FIGS. 5A and 5B, a maximum value of the absolute value of the quantization value to be obtained by the y-value digital signal as the output signal is {1}. For this reason, the above case where the predetermined value of the absolute value of the first output signal is {2} satisfies this condition. Since the maximum value of the absolute value of the quantization value to be obtained by the y-value digital signal as the output signal to the loop filter 4 is expressed by an integer, preferably like this embodiment, the predetermined value in the selector 6 may be set so as to be equal to the following quantization value to be obtained by adding {1} to that maximum value.

Therefore, the y-value quantizer 7 and the selector 6 operate as the so-called extended quantizer having input/output characteristics illustrated in FIG. 5B, and output a feedback signal to be fed back to the loop filter 4. As a result, when the amplitude level of the input signal input into the y-value quantizer 7 is comparatively high, the y-value quantizer 7 and the selector 6 operate to feed back the feedback signal, which bypasses the y-value quantizer 7 when the absolute value of the amplitude level is the predetermined value or more, to the loop filter 4.

Further, the feedback signal fed back from the y-value quantizer 7 and the selector 6 to the loop filter 4 is branched to be input into the n-value ΔΣ modulating unit 8. The n-value ΔΣ modulating unit 8 executes the ΔΣ modulation signal processing, and outputs the n-value digital signal to the output terminal 3. Therefore, when the amplitude level of the input signal input into the y-value quantizer 7 is comparatively high, the y-value quantizer 7 and the selector 6 operate to input a signal, which bypasses the y-value quantizer 7 when the absolute value of the amplitude level is the predetermined value or more, into the n-value ΔΣ modulating unit 8.

That is to say, in the ΔΣ modulator 1, the level of the feedback signal to the loop filter 4 configuring the ΔΣ modulator 1 is increased according to the level of the absolute value of the first output signal output from the loop filter 4 so that the ΔΣ modulation signal processing can be stably executed. When the level of the feedback signal input into the subtractor 11 or 14 of the loop filter 4 increases, the amplitude level of the first output signal output from the loop filter 4 and input into the y-value quantizer 7 is comparatively drops. For this reason, the operation of the ΔΣ modulation signal processing can be stabilized. This is equivalent to a case where in the ΔΣ modulator 1, when a quantization error of the y-value quantizer 7 exceeds a certain threshold, the quantization error is automatically controlled to be zero.

Further, in the ΔΣ modulator 1, the intervention for correcting the internal state of the ΔΣ modulator 1 is not necessary for stabilizing the operation of the ΔΣ modulation signal processing, and a limiter does not have to be provided to a route of the feedback. Even when them-value digital signal input into the ΔΣ modulator 1 is attenuated in advance and a head room of the digital signal is secured, a margin for attenuation can be minimum.

Further, when n=2, the n-value ΔΣ modulating unit 8 can be configured as a first order ΔΣ modulating unit for executing first-order ΔΣ modulation signal processing or a second order ΔΣ modulating unit for executing second order ΔΣ modulation signal processing. When the first order ΔΣ modulating unit or the second order ΔΣ modulating unit where the operation is not unstable are used, the operation of the 1-bit ΔΣ modulation signal processing can be stabilized. Further, in the ΔΣ modulator 1, the n-value ΔΣ modulating unit 8 is set so that n=2, and y is set to 3 or more in the y-value quantizer 7 in order to output a 1-bit ΔΣ modulation signal, and a 3 or more-value ΔΣ modulation signal can be input into the n-value ΔΣ modulating unit 8.

Further, the ΔΣ modulator 1 can realize the stable 1-bit ΔΣ modulator 1 with a simple constitution when n=y=2. In the y-value quantizer 7, the threshold with respect to the input signal for setting the quantization value of the second output signal output as {−1} or {1} may be set to a zero value {0} of the input signal. Further, since the y-value quantizer 7 outputs the second output signal so that the second output signal includes positive and negative quantization values of which absolute values are equal to each other $\{-1, 1\}$, the quantization error in the conversion into the binary digital signal to be output is decreased.

Figure 6:
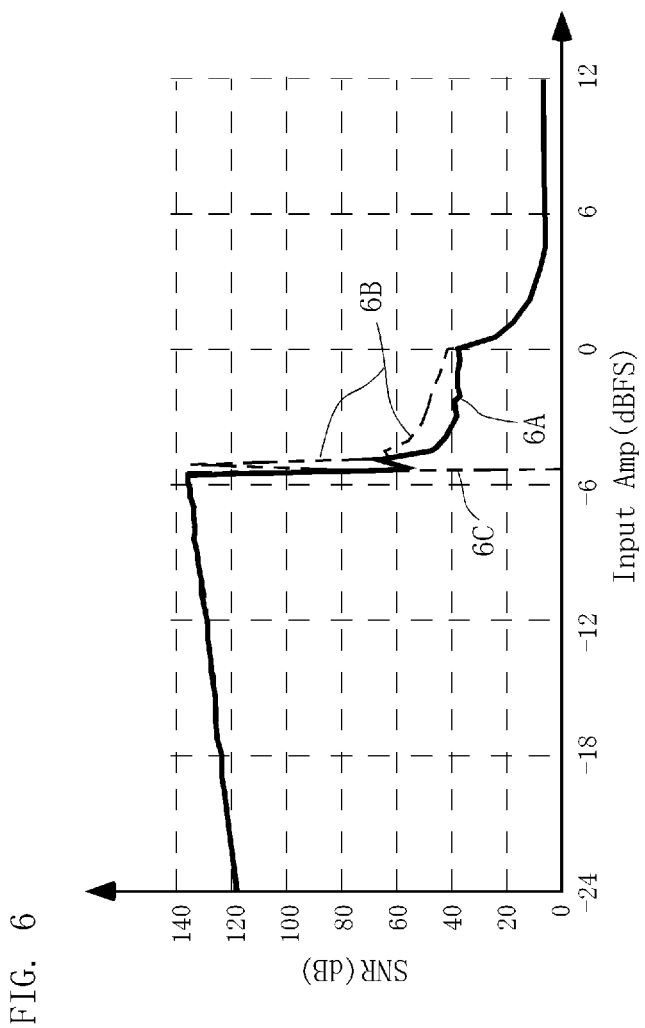
FIG. 6 is a graph describing a characteristic curve of the SNR level with respect to the input signal level of the ΔΣ modulator 1.

Lines 6A to 6C in FIG. 6 are graphs describing characteristic curves of the SNR level with respect to the input signal level of the ΔΣ modulator 1 similarly to lines 3A and 3B in FIG. 3.

Line 6A illustrates the characteristic curve of the SNR level of the 1-bit ΔΣ modulator 1 according to this embodiment. The loop filter 4 of the ΔΣ modulator 1 employs 8th-order CRFB (Cascade of Resonators with distributed Feedback) (not illustrated), and m=2^16 and n=y=2. Further, a curved line 6B represents another characteristic curve of the SNR level of the 1-bit ΔΣ modulator 1 according to this embodiment, and its different point from the case of line 6A is that the setting value y in the y-value quantizer 7 is set to y=4, and any one of 4-value quantization values is output as the second output signal according to the first output signal. Further, the curved line 6C illustrates a characteristic curve of the SNR level of the ΔΣ modulator 10 according to a comparative example (not illustrated).

The ΔΣ modulator 10 according to the comparative example (not illustrated) is the conventional 1-bit ΔΣ modulator configured as the ΔΣ modulator 1 of this embodiment that does not include the selector 6, and is equivalent to a case where the second output signal output from the y-value quantizer 7 is fed back directly to the loop filter 4. Therefore, illustration and description of the ΔΣ modulator 10 of the comparative example are omitted.

As illustrated in by line 6C, in the ΔΣ modulator 10 of the comparative example, when the amplitude level of the sine-wave signal input of the m-value digital signal to be input becomes high to exceed −6 dBFS, the SNR level abruptly drops, and the SNR reaches 0 dB. This means that the operation of the ΔΣ modulator 10 becomes unstable, and a 1-bit digital signal as a suitable ΔΣ modulation signal is not output from the output terminal 3.

On the other hand, as illustrated by line 6A or 6B, in the ΔΣ modulator 1 of this embodiment, when the amplitude level of the sine-wave signal input of the input m-value digital signal becomes high to exceed −6 dBFS, the SNR level abruptly drops similarly. However, even when the amplitude level of the input further becomes higher, the SNR does not reach 0 dB. This means that the ΔΣ modulator 1 of this embodiment absolutely stably operates and the 1-bit digital signal as the ΔΣ modulation signal that is more suitable than the conventional example is output from the output terminal 3.

In the ΔΣ modulator 1 in this emb-odiment, even when the amplitude level of the input signal input into the y-value quantizer 7 is comparatively higher than the conventional technique, the operation of the ΔΣ modulation signal processing can be stabilized. That is to say, the level of the feedback signal to the loop filter 4 configuring the ΔΣ modulator is increased according to the absolute value level of the first output signal output from the loop filter 4, and the ΔΣ modulation signal processing can be stably executed. As a result, also when the amplitude level of the input signal input into the y-value quantizer 7 becomes comparatively high, and the intervention for correcting the internal state of the modulator is not necessary so that the operation of the ΔΣ modulation signal processing can be stabilized.

The above description refers to the case where m=2^16, n=y=2 or n=2, y=4, but the m value that means the quantization value of the digital audio signal input into the input terminal 2 may be an integer of 3 or more that satisfies a relationship such that m≥y≥n. Further, the n value that means the quantization value of the digital audio signal output to the output terminal 3 may be an integer of 2 or more smaller than m. For example, the ΔΣ modulator 1 can be configured as a 3-value ΔΣ modulator that outputs any one of 3-value quantization values $\{-1, 0, 1\}$ according to the first output signal.

Further, in the above embodiments, the ΔΣ modulator 1 is configured by a digital signal processor (DSP), but obviously the ΔΣ modulator 1 that realizes the ΔΣ modulation signal processing may be configured only by another processor (not illustrated) having an arithmetic function for treating audio signals. Also in this case, the program, described below, is downloaded into the processor of the computer so as to be executed. Therefore, the above reference symbols in FIG. 4 to FIG. 6 are shared in common with the following description, and a flowchart of the program of the ΔΣ modulation signal processing is omitted.

The program of the ΔΣ modulation signal processing causes the processor to execute step S1 of executing the signal processing in the loop filter 4 for inputting the m-value digital signal into the subtractor, step S2 of executing the n-value quantization signal processing by means of the y-value quantizer 7 for inputting the first output signal output from the loop filter 4 and outputting the second output signal that is the y-value digital signal, step S3 of executing the selection processing for allowing the selector 6 to input the first output signal and the second output signal, to feed back the first output signal to the subtractor of the loop filter 4 when the absolute value of the first output signal is the predetermined value or more, and to feedback the second output signal to the subtractor of the loop filter 4 when the absolute value of the first output signal is less than a predetermined value, and step S4 of executing ΔΣ modulation processing for causing the selector 6 to input a signal fed back to the loop filter 4 and causing the n-value ΔΣ modulating unit 8 to output the n-value digital signal.

At step S3, the predetermined value of the selection processing in the selector 6 is set to be larger than the maximum value of the absolute value of the quantization value to be obtained by the y-value digital signal. Therefore, the program of the ΔΣ modulation signal processing enables the m-value digital signal input into the processor to be converted into the y-value digital signal so as to output the y-value digital signal. Further, the level of the feedback signal to the loop filter 4 configuring the ΔΣ modulator 1 is increased according to the level of the absolute value of the first output signal output from the loop filter 4 so that the ΔΣ modulation signal processing can be stably executed.

Obviously, the processor can realize the stable 1-bit ΔΣ modulator 1 with a simple constitution when n=y=2. In the y-value quantizer 7, the threshold with respect to the input signal for deciding the quantization value of the output second output signal as $\{-1\}$ or $\{1\}$ may be set to the zero value $\{0\}$ of the input signal. Further, the y-value quantizer 7 may be set as to include the positive and negative quantization values $\{-1, 1\}$ of which absolute values are equal to each other. The quantization error in the conversion into the binary digital signal to be output is reduced.

The program of the ΔΣ modulation signal processing can be executed not only in the processor of the computer but also in an electronic device mounted with a processor capable of treating digital audio signals. For example, even in a mobile phone or a smart phone that does not have a processor dedicated to audio signals, an arithmetic ability for digital audio signal may be provided to a CPU.

What is claimed is:

1. A ΔΣ modulator for converting an m-value (m: an integer of 3 or more) digital signal into an n-value (n: an integer of 2 or more smaller than m) digital signal and outputting the n-value output signal, the ΔΣ modulator comprising:
a loop filter including a plurality of cascaded integrators each having a subtractor at its input, for inputting the m-value digital signal into the subtractor at a first integrator in the plurality of cascaded integrators;
an n-value quantizer for inputting a first output signal output from the loop filter and outputting a second output signal that is the n-value digital signal, the first output signal based on an output of a last integrator in the plurality of cascaded integrators; and
a selecting device for inputting the first output signal and the second output signal therein and selecting between feeding back the first output signal and the second output signal based on the first output signal and not based on outputs of the first integrator to next-to-last integrator in the plurality of cascaded integrators, and feeding back the first output signal to all of the subtractors of the loop filter when an absolute value of the first output signal is a predetermined value or more, and feeding back the second output signal to all of the subtractors of the loop filter when the absolute value of the first output signal is less than a predetermined value, wherein
the predetermined value in the selecting device is set to be larger than a maximum value of an absolute value of a quantization value to be obtained by the n-value digital signal.

2. The ΔΣ modulator according to claim 1, wherein when n=2, in the n-value quantizer, a threshold with respect to the input signal for deciding a signal value of a binary digital signal to be output to a first quantization value or a second quantization value is set to zero.

3. The ΔΣ modulator according to claim 2, wherein when n=2, the first quantization value and the second quantization value of the n-value quantizer are set as positive and negative quantization values of which absolute values are equal to each other.

4. A non-transitory computer readable medium storing a program for causing a computer to execute ΔΣ modulation signal processing for converting an m-value (m: an integer of 3 or more) digital signal into an n-value (n: an integer of 2 or more smaller than m) digital signal and outputting the n-value digital signal, the program causing a processor of the computer to execute:
a step of executing signal processing in a loop filter for inputting the m-value digital signal into a subtractor, the loop filter including a plurality of cascaded integrators each having a subtractor at its input, wherein the m-value digital signal is input into the subtractor at a first integrator in the plurality of cascaded integrators, and the loop filter outputs a first output signal based on an output of a last integrator in the plurality of cascaded integrators;
a step of executing n-value quantization signal processing for inputting the first output signal to be output from the loop filter and outputting a second output signal as the n-value digital signal; and
a step of executing selection processing for inputting the first output signal and the second output signal and selecting between feeding back the first output signal and the second output signal based on the first output signal and not based on outputs of the first integrator to next-to-last integrator in the plurality of cascaded integrators, feeding back the first output signal to all of the subtractors of the loop filter when an absolute value of the first output signal is a predetermined value or more, and feeding back the second output signal to all of the subtractors of the loop filter when the absolute value of the first output signal is less than a predetermined value, wherein
the predetermined value in the selection processing is set to be larger than a maximum value of an absolute value of a quantization value to be obtained by the n-value digital signal.

5. A ΔΣ modulator for converting an m-value (m: an integer of 3 or more) digital signal into an n-value (n: an integer of 2 or more smaller than m) digital signal and outputting the n-value output signal, the ΔΣ modulator comprising:
a loop filter including a plurality of cascaded integrators each having a subtractor at its input, for inputting the m-value digital signal into the subtractor at a first integrator in the plurality of cascaded integrators;
a y-value quantizer for inputting a first output signal to be output from the loop filter and outputting a second output signal as a y-value (y: an integer of 2 or more that satisfies m≥y≥n) digital signal, the first output signal based on an output of a last integrator in the plurality of cascaded integrators;
a selecting device for inputting the first output signal and the second output signal therein and selecting between feeding back the first output signal and the second output signal based on the first output signal and not based on outputs of the first integrator to next-to-last integrator in the plurality of cascaded integrators, feeding back the first output signal to all of the subtractors of the loop filter when an absolute value of the first output signal is a predetermined value or more, and feeding back the second output signal to all of the subtractors of the loop filter when the absolute value of the first output signal is less than a predetermined value; and
a ΔΣ modulating unit for inputting a signal fed back to the loop filter by the selection device and outputting the n-value digital signal, wherein
the predetermined value in the selection device is set to be larger than a maximum value of an absolute value of a quantization value to be obtained by the n-value digital signal.

6. The ΔΣ modulator according to claim 5, wherein when n=2, the ΔΣ modulating unit is a first order ΔΣ modulating unit for executing first order ΔΣ modulation signal processing or a second order ΔΣ modulating unit for executing second order ΔΣ modulation signal processing.

7. The ΔΣ modulator according to claim 5, wherein when n=y=2, a threshold with respect to an input signal for deciding a signal value of a binary digital signal output by the y-value quantizer is set to a first quantization value or a second quantization value.

8. The ΔΣ modulator according to claim 7, wherein when n=y=2, the first quantization value and the second quantization value of the y-value quantizer are set as positive and negative quantization values of which absolute values are equal to each other.

9. A non-transitory computer readable medium storing a program for causing a computer to execute ΔΣ modulation signal processing for converting an m-value (m: an integer of 3 or more) digital signal into an n-value (n: an integer of 2 or more smaller than m) digital signal and outputting the n-value digital signal, the program causing a processor of the computer to execute:
- a step of executing signal processing in a loop filter for inputting the m-value digital signal into a subtractor, the loop filter including a plurality of cascaded integrators each having a subtractor at its input, wherein the m-value digital signal is input into the subtractor at a first integrator in the plurality of cascaded integrators, and the loop filter outputs a first output signal based on an output of a last integrator in the plurality of cascaded integrators;
- a step of executing y-value quantization signal processing for inputting the first output signal to be output from the loop filter and outputting a second output signal as a y-value digital signal;
- a step of executing selection processing for inputting the first output signal and the second output signal and selecting between feeding back the first output signal and the second output signal based on the first output signal and not based on outputs of the first integrator to next-to-last integrator in the plurality of cascaded integrators, feeding back the first output signal to all of the subtractors of the loop filter when an absolute value of the first output signal is a predetermined value or more, and feeding back the second output signal to all of the subtractors of the loop filter when the absolute value of the first output signal is less than a predetermined value; and
- a step of executing ΔΣ modulation processing for inputting a signal to be fed back to the loop filter by a selecting device and outputting the n-value digital signal, wherein the predetermined value in the selection processing is set to be larger than a maximum value of an absolute value of a quantization value to be obtained by the n-value digital signal.

* * * * *